United States Patent
Chen et al.

(10) Patent No.: US 8,536,926 B2
(45) Date of Patent: Sep. 17, 2013

(54) GILBERT MIXER

(75) Inventors: Ying Chen, Eindhoven (NL); Marcel Geurts, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/306,930

(22) Filed: Nov. 29, 2011

(65) Prior Publication Data

US 2012/0133418 A1    May 31, 2012

(30) Foreign Application Priority Data

Nov. 30, 2010    (EP) .................................... 10252023

(51) Int. Cl.
*G06G 7/16*    (2006.01)

(52) U.S. Cl.
USPC .......................................... 327/359; 327/356

(58) Field of Classification Search
USPC .......................................... 327/359, 356, 357
See application file for complete search history.

(56) References Cited

U.S. PATENT DOCUMENTS

| | | | |
|---|---|---|---|
| 4,654,886 A | 3/1987 | Selim | |
| 5,086,512 A | 2/1992 | Bartz | |
| 5,369,794 A | 11/1994 | Martineau | |
| 6,073,002 A | 6/2000 | Peterson | |
| 6,232,848 B1 | 5/2001 | Manku | |
| 6,711,396 B1 | 3/2004 | Bergsma et al. | |
| 6,892,061 B2* | 5/2005 | Asam | 455/313 |
| 8,019,314 B2* | 9/2011 | Tomiyama | 455/323 |
| 2004/0132424 A1 | 7/2004 | Aytur et al. | |
| 2005/0118979 A1* | 6/2005 | Langenberg et al. | 455/333 |
| 2006/0014512 A1 | 1/2006 | Khorram | |
| 2006/0094395 A1 | 5/2006 | Lee et al. | |
| 2007/0049220 A1 | 3/2007 | Pan | |
| 2007/0123182 A1 | 5/2007 | Dekker | |
| 2007/0142019 A1 | 6/2007 | Mattisson et al. | |
| 2008/0014873 A1 | 1/2008 | Krayer et al. | |
| 2010/0056091 A1 | 3/2010 | Jang et al. | |
| 2012/0262216 A1* | 10/2012 | Chen et al. | 327/356 |

FOREIGN PATENT DOCUMENTS

| | | |
|---|---|---|
| CN | 101162910 A | 4/2008 |
| CN | 101345537 A | 1/2009 |
| CN | 101420236 A | 4/2009 |
| EP | 0 338 125 A1 | 10/1989 |
| EP | 1 484 838 A2 | 12/2004 |
| GB | 2 213 006 A | 8/1989 |
| GB | 2 323 228 A | 9/1998 |
| IL | 90125 A | 12/1994 |
| JP | 2005-020288 A | 1/2005 |
| JP | 2005-130119 A | 5/2005 |
| WO | 2007/100678 A2 | 9/2007 |

OTHER PUBLICATIONS

Extended European Search Report for European Patent Applin. No. 10252023.6 (May 12, 2011)xxx.

* cited by examiner

*Primary Examiner* — Lincoln Donovan
*Assistant Examiner* — Jung H. Kim

(57) ABSTRACT

A Gilbert mixer (200) comprising four switching transistors (Q3, Q4, Q5, Q6), two intermediate frequency transistors (Q1, Q2), and one or more DC decoupling components (202). The one or more DC decoupling components (202) are coupled between the switching transistors (Q3, Q4, Q5, Q6) and the intermediate frequency transistors (Q1, Q2) in order to DC decouple the switching transistors (Q3, Q4, Q5, Q6) from the intermediate frequency transistors (Q1, Q2).

14 Claims, 4 Drawing Sheets

PRIOR ART

GILBERT MIXER

CROSS-REFERENCE TO RELATED APPLICATIONS

This application claims the priority under 35 U.S.C. §119 of European patent application no. 10252023.6, filed on Nov. 30, 2010, the contents of which are incorporated by reference herein.

In radio frequency (RF) front-ends of modern wireless transceivers, the Gilbert mixer is the most popular of the known active mixer topologies. As described in more detail below, local oscillator (LO) feedthrough to the output of the Gilbert mixer can degrade the performance of the system.

The listing or discussion of a prior-published document or any background in the specification should not necessarily be taken as an acknowledgement that the document or background is part of the state of the art or is common general knowledge.

According to a first aspect of the invention, there is provided a Gilbert mixer comprising:
    four switching transistors;
    two intermediate frequency transistors; and
    one or more DC decoupling components coupled between the switching transistors (Q3, Q4, Q5, Q6) and the intermediate frequency transistors (Q1, Q2) in order to DC decouple the switching transistors (Q3, Q4, Q5, Q6) from the intermediate frequency transistors (Q1, Q2).

By DC decoupling the switching transistors from the intermediate frequency transistors, any mismatches between the two intermediate frequency transistors can have a reduced affect on local oscillator (LO) feedthrough at the output of the Gilbert mixer. The exclusion of the DC components of the current through the two intermediate frequency transistors from the switching stage of the Gilbert mixer can avoid a requirement for the DC current through the first intermediate frequency transistor (Q1) to cancel out the DC current through the second intermediate frequency transistor (Q2). Therefore any mismatches or variations in tolerances between the two intermediate frequency transistors (Q1, Q2) does not significantly degrade the performance of the Gilbert mixer.

The Gilbert mixer may further comprise a resistive component coupled to the emitter or source of each of the switching transistors (Q3, Q4, Q5, Q6), in order to bias the switching transistors. Any mismatch between the resistive components can have a lesser affect on local oscillator feedthrough than mismatch between the intermediate frequency transistors (Q1, Q2). The resistive components may have large values. The overall performance of the Gilbert mixer can be improved even with the addition of resistive components.

To enable better and more abrupt switching, the DC currents flowing through the switching transistors should be low. "Low" DC currents flowing through the switching transistors may be of the order of 50, 100, 200, 500 μA. Thus, the DC currents flowing through the resistive components are also low. Therefore, the use of resistive components with large resistance values is not a problem for normal DC supply, because of the small voltages dropped across these resistive components. In addition, the signal loss due to the resistive components can be reduced/minimized because of the large resistance values and hence a low loading effect. A "large" value for the resistive components may be of the order of 1, 2, 5, 10, 20 kΩ.

The one or more DC decoupling components may be connected between the emitters of the switching transistors (Q3, Q4, Q5, Q6) and the collectors of the intermediate frequency transistors (Q1, Q2). The one or more DC decoupling components may comprise one or more capacitors, filters, or any other components that are capable of providing the required DC decoupling.

The transistors may be bipolar junction transistors (BJT's) or field effect transistors (FETs).

The collector of the first switching transistor (Q3) may be coupled to the first plate of a first decoupling capacitor, and the second plate of the first decoupling capacitor may be coupled to the collector or emitter of the first intermediate frequency transistor (Q1). The collector of the second switching transistor (Q4) may be coupled to the first plate of a second decoupling capacitor, and the second plate of the second decoupling capacitor may be coupled to the collector or emitter of the first intermediate frequency transistor (Q1). The collector of the third switching transistor (Q5) may be coupled to the first plate of a third decoupling capacitor, and the second plate of the third decoupling capacitor may be coupled to the collector or emitter of the second intermediate frequency transistor (Q2). The collector of the fourth switching transistor (Q6) may be coupled to the first plate of a fourth decoupling capacitor, and the second plate of the fourth decoupling capacitor may be coupled to the collector or emitter of the second intermediate frequency transistor (Q2).

The emitter of the first switching transistor (Q3) may be coupled to the first plate of a first decoupling capacitor, and the second plate of the first decoupling capacitor may be coupled to the collector or emitter of the first intermediate frequency transistor (Q1). The emitter of the second switching transistor (Q4) may be coupled to the first plate of a second decoupling capacitor, and the second plate of the second decoupling capacitor may be coupled to the collector or emitter of the first intermediate frequency transistor (Q1). The emitter of the third switching transistor (Q5) may be coupled to the first plate of a third decoupling capacitor, and the second plate of the third decoupling capacitor may be coupled to the collector or emitter of the second intermediate frequency transistor (Q2). The emitter of the fourth switching transistor (Q6) may be coupled to the first plate of a fourth decoupling capacitor, and the second plate of the fourth decoupling capacitor may be coupled to the collector or emitter of the second intermediate frequency transistor (Q2).

The source of the first switching transistor (Q3) may be coupled to the first plate of a first decoupling capacitor, and the second plate of the first decoupling capacitor may be coupled to the drain of the first intermediate frequency transistor (Q1). The source of the second switching transistor (Q4) may be coupled to the first plate of a second decoupling capacitor, and the second plate of the second decoupling capacitor may be coupled to the drain of the first intermediate frequency transistor (Q1). The source of the third switching transistor (Q5) may be coupled to the first plate of a third decoupling capacitor, and the second plate of the third decoupling capacitor may be coupled to the drain of the second intermediate frequency transistor (Q2). The source of the fourth switching transistor (Q6) may be coupled to the first plate of a fourth decoupling capacitor, and the second plate of the fourth decoupling capacitor may be coupled to the drain of the second intermediate frequency transistor (Q2).

It will be appreciated that any components that are described as being "coupled" could be coupled directly or indirectly. That is, one or more additional components may, or may not, be connected in the circuit path between two "coupled" components.

The Gilbert mixer may comprise a resistor connected between ground and the emitter of each of the switching transistors (Q3, Q4, Q5, Q6).

There may be provided an integrated circuit comprising any Gilbert mixer disclosed herein.

A description is now given, by way of example only, with reference to the accompanying drawings, in which.

Figure 3A:
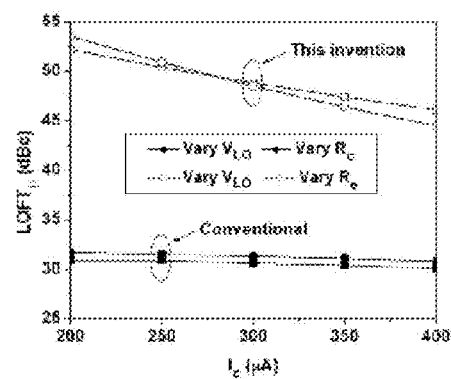
Figure 3B:
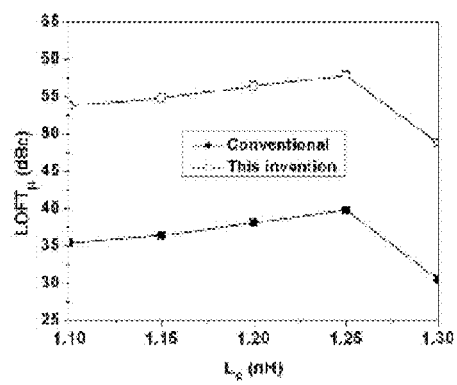
Figure 4A:
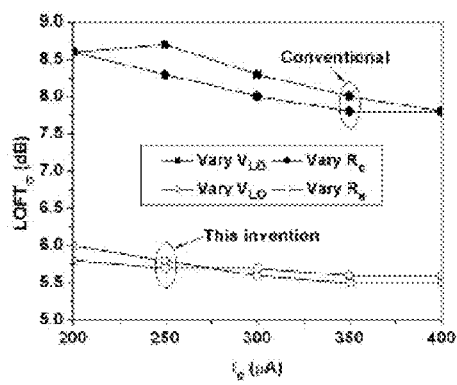
Figure 4B:
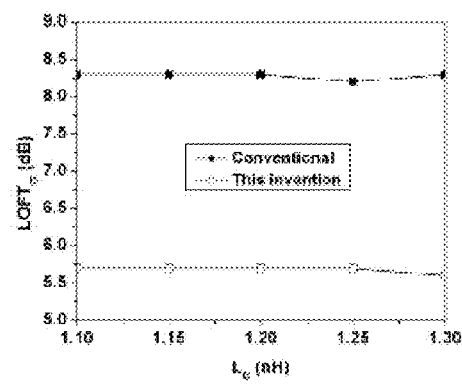
Figure 5:
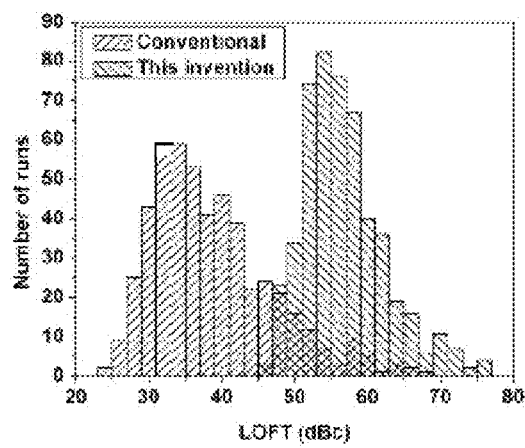

FIGS. 3a and 3b graphically illustrate a comparison of the mean value for LO feedthrough of the prior art and an embodiment of the present invention;

FIGS. 4a and 4b graphically illustrate a comparison of the standard deviation value for LO feedthrough of the prior art and an embodiment of the present invention; and FIG. 5 illustrates a further comparison between the prior art and an embodiment of the invention.

One or more embodiments of the invention relate to a Gilbert mixer having four switching transistors and two intermediate frequency transistors. It has been determined that DC (direct current) decoupling the intermediate frequency transistors from the switching transistors improves the local oscillator feedthrough cancellation of the Gilbert mixer. This can reduce the effects of device mismatch and therefore improve the effectiveness of signal cancellations that occur in a Gilbert mixer.

Figure 1:
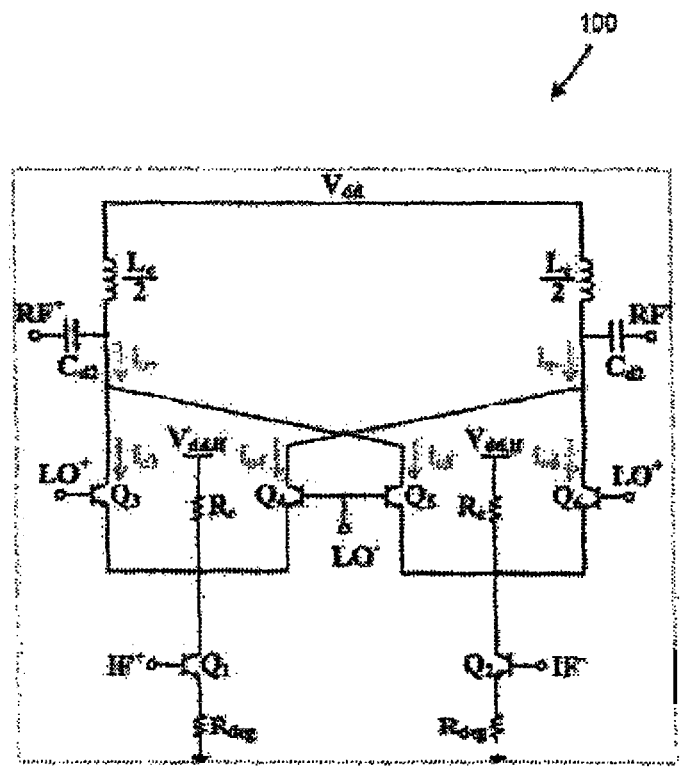
FIG. 1 illustrates a prior art Gilbert mixer.

FIG. 1 illustrates a conventional double-balanced up-conversion Gilbert mixer 100 with current bleeding, as is known in the art. The Gilbert mixer includes four switching transistors Q3, Q4, Q5, Q6, and the base of each of these transistors is provided with a local oscillator (LO) signal. The Gilbert mixer 100 also includes two intermediate frequency transistors Q1, Q2, the bases of which are provided with an intermediate frequency (IF) signal. An output radio frequency (RF) signal is taken from the collectors of the four switching transistors Q3, Q4, Q5, Q6.

It is known to use Gilbert mixers 100 in the front end of radio frequency (RF) wireless transceivers. Local oscillator (LO) feedthrough suppression is an important parameter in the mixer design as LO feedthrough can cause both in-band and out-of-band interference and degrade the system performance.

The double-balanced Gilbert mixer shown in FIG. 1 can suppress the LO feedthrough to an extent, although this cancellation can be incomplete due to random device mismatch (tolerance in component values) that is created during wafer processing. Therefore, prior art LO feedthrough suppression can have limitations.

A known way to improve the LO feedthrough suppression in the prior art is to use additional filtering at the mixer output, which increases the circuit complexity.

A single conversion low intermediate frequency (low-IF) architecture allows low-power, low-cost conversion, and also a less complex design of the transceiver front-end. Furthermore, the single conversion low-IF architecture does not suffer the problems of DC offset and flicker noise associated with the direct conversion architecture. However, for a low-IF single up-conversion mixer, the LO frequency is so close to the desired RF frequency that the filtering of the LO feedthrough requires high quality factor (Q-factor) filters. Usually this filtering has to be done using discrete off-chip filters, which prevents the monolithic integration of the transceiver front-end system. Therefore, single conversion low intermediate frequency (low-IF) architectures can be considered as unacceptable in some situations.

Returning to FIG. 1, the bipolar transistors Q1, Q2 together with degeneration resistors $R_{deg}$ that are connected between the emitters of the transistors Q1, Q2 and ground can together be considered as the transconductance stage of the Gilbert mixer 100. The switching transistors Q3, Q4, Q5, Q6 can be considered as the LO switching stage. The Gilbert mixer 100 also includes bleeding resistors $R_c$ that are connected between $V_{dd,if}$ and the junctions between the emitters of the switching transistors Q3, Q4, Q5, Q6 and the collectors of the intermediate frequency transistors Q1, Q2.

The DC currents at the collectors of the switching transistors will be referred to as $I_{c3}$, $I_{c4}$, $I_{c5}$, $I_{c6}$ for switching transistors Q3, Q4, Q5, Q6 respectively. For an ideal Gilbert mixer 100, the currents at the collectors of the four switching transistors Q3, Q4, Q5, Q6 are all equal. The purpose of the bleeding resistors $R_c$ is to allow small currents for $I_{c3}$, $I_{c4}$, $I_{c5}$, $I_{c6}$ while maintaining the same currents through the intermediate frequency transistors Q1, Q2.

Assuming ideal switching and large values for $R_c$, the output currents through the switching transistors due to first-order mixing can be written as:

$$i_{o3} = \frac{2}{\pi} \cdot \cos(\omega_{LO} t) \cdot [I_{c3} + i_{IF}\cos(\omega_{IF} t)] \quad (1)$$

$$i_{o4} = -\frac{2}{\pi} \cdot \cos(\omega_{LO} t) \cdot [I_{c4} + i_{IF}\cos(\omega_{IF} t)] \quad (2)$$

$$i_{o5} = -\frac{2}{\pi} \cdot \cos(\omega_{LO} t) \cdot [I_{c5} - i_{IF}\cos(\omega_{IF} t)] \quad (3)$$

$$i_{o6} = \frac{2}{\pi} \cdot \cos(\omega_{LO} t) \cdot [I_{c6} - i_{IF}\cos(\omega_{IF} t)] \quad (4)$$

In accordance with a conventional Gilbert mixer, the output RF currents ($i_{o+}$ and $i_{o-}$) reach the sum of two of the signals through the switching transistors as follows:

$$i_{o+} = i_{o3} + i_{o5} = \frac{4}{\pi} \cdot \cos(\omega_{LO} t) \cdot i_{IF}\cos(\omega_{IF} t) + \frac{2}{\pi} \cdot \cos(\omega_{LO} t) \cdot (I_{c3} - I_{c5}) \quad (5)$$

$$i_{o-} = \quad (6)$$
$$i_{o4} + i_{o6} = -\frac{4}{\pi} \cdot \cos(\omega_{LO} t) \cdot i_{IF}\cos(\omega_{IF} t) + \frac{2}{\pi} \cdot \cos(\omega_{LO} t) \cdot (I_{c6} - I_{c4})$$

It can be seen from equations (5) and (6) that any mismatches between $I_{c3}$ and $I_{c5}$ will cause local oscillator feedthrough in output current $i_{o+}$. That is, $\cos(\omega_{LO} t)$ is multiplied by a non-zero value.

The mismatch between the currents $I_{c3}$ and $I_{c5}$, and also $I_{c4}$ and $I_{c6}$, can be caused by device mismatches in the Gilbert mixer 100.

Embodiments disclosed herein can reduce the LO feedthrough of a double-balanced Gilbert mixer due to device mismatch in the circuit, and can involve less complex circuitry, and an easier implementation, when compared with the prior art.

It has been identified that the currents through the intermediate frequency transistors $i_{c1}$ and $i_{c2}$ are DC coupled to the currents through the switching transistors $I_{c3}$ to $I_{c6}$. Therefore, any mismatches in the current through the intermediate frequency transistors translate to a mismatch in the currents through the switching transistors. As an example, if $I_{c1}$ is greater than $I_{c2}$ due to component mismatch, then $I_{c3}$ will be greater than $I_{c5}$, and $I_{c4}$ will be greater then $I_{c6}$. If this is the case, then local oscillator feedthrough will not be completely cancelled, as will be appreciated from the above description in relation to the last terms in equations (5) and (6).

One or more embodiments disclosed herein can decouple the DC paths of one or more transistors in the Gilbert mixer, with each transistor being individually biased. In this way, the impact of the mismatch due to component tolerances of the intermediate frequency transistors (Q1, Q2) can be reduced or removed, and $I_{c1}$, $I_{c2}$ can be decoupled from the current through the switching transistors (Q3, Q4, Q5, Q6).

Figure 2:
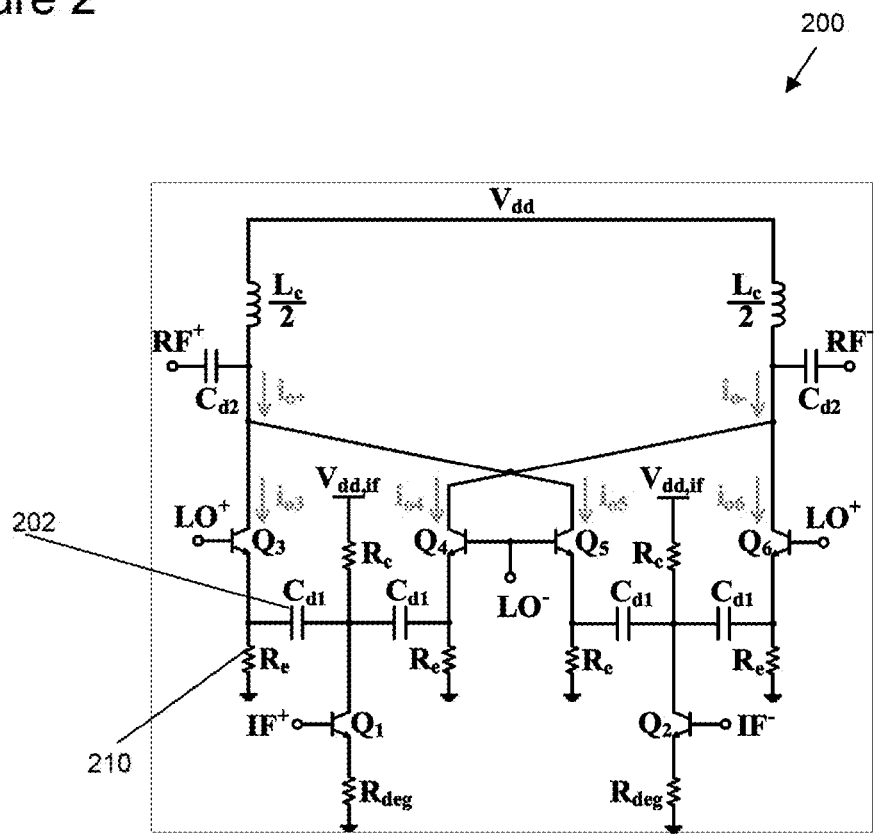
FIG. 2 illustrates a Gilbert mixer according to an embodiment of the invention.

FIG. 2 illustrates a Gilbert mixer 200 according to an embodiment of the invention. The Gilbert mixer 200 includes four switching transistors Q3, Q4, Q5 and Q6. The collectors of transistors Q3 and Q5 are both connected to a first RF output (RF$^+$) via a capacitor $C_{d2}$. The collectors of transistors Q4 and Q6 are connected to a second radio frequency output (RF$^-$) via another capacitor $C_{d2}$.

The bases of transistors Q3 and Q6 are connected to a first local oscillator input (LO$^+$), and the bases of transistors Q4 and Q5 are connected to a second local oscillator input (LO$^-$).

In the prior art, and as shown in FIG. 1, the emitters of transistors Q3 and Q4 are directly connected to the collector of transistor Q1. Similarly, the emitters of Q5 and Q6 are connected directly to the collector of Q2 in the prior art. However, according to the embodiment of FIG. 2, capacitors are provided between the emitters of the switching transistors Q3, Q4, Q5 and Q6 and the collectors of the intermediate frequency transistors Q1 and Q2 in order to DC decouple transistors Q3, Q4, Q5 and Q6 from transistors Q1 and Q2.

It has been found that this DC decoupling greatly improves the performance of the Gilbert mixer without requiring complex or expensive additional circuitry. Such an embodiment of the invention can enable the improved Gilbert mixer to be provided on a single integrated circuit (IC).

In the embodiment of FIG. 2, the emitter of Q3 is connected to a first plate of a decoupling capacitor $C_{d1}$ 202, and the second plate of the decoupling capacitor $C_{d1}$ 202 is connected to the collector of Q1. This second plate of $C_{d1}$ 202 is also connected to $V_{dd,if}$ via bleeding resistor $R_c$. The decoupling capacitor $C_{d1}$ prevents any DC offset that may be present in the current through Q1 being passed to the current through Q3. Therefore, any mismatch/tolerance in the performance of Q1 (when compared with the other IF transistor Q2) is not passed through to the current flowing through Q3, and therefore reduces any local oscillator feedthrough that may be passed to the radio frequency output (RF$^+$) of the Gilbert mixer 200. Embodiments of the invention can reduce/remove the impact of any differences between the IF transistors (Q1 and Q2).

A resistor $R_e$ 210 is connected between the emitter of transistor Q3 and ground. This resistor $R_e$ 210 is included to bias the switching transistor Q3 as the previous DC current paths from Q3 to resistor $R_c$ and $R_{deg}$ have been removed by insertion of the decoupling capacitor $C_{d1}$ 202. $R_e$ can have a large resistance value. An advantage to using large resistance values for $R_e$ 210 is that there is likely to be better resistance value matching between each of the corresponding resistors $R_e$ in the Gilbert mixer 200, and therefore any negative effects of different resistance values can be reduced. To enable better and more abrupt switching, the DC currents flowing through the switching transistors should be low. "Low" DC currents flowing through the switching transistors may be of the order of 50, 100, 200, 500 μA. Thus the DC currents flowing through the resistors $R_e$ are also low. Therefore, using resistors $R_e$ with large resistance values is not a problem for normal DC supply, because of the small voltages dropped across these resistors $R_e$. In addition, the signal loss due to $R_e$ is reduced/minimized because of the large resistance values for $R_e$ and hence a low loading effect. A "large" value for $R_e$ 210 may be of the order of 1, 2, 5, 10, 20 kΩ.

The other three switching transistors Q4, Q5, Q6 are connected to other decoupling capacitors $C_{d1}$ and resistors $R_e$ in a similar way to the first switching transistor Q3, as can be seen from FIG. 2.

It will be appreciated that the decoupling capacitors $C_{d1}$ 202 are examples of DC decoupling components that can allow alternating current (AC) signals to pass, whilst blocking direct current (DC) signals. In other examples, any suitable DC decoupling components, such as filters, or transformers, or amplifiers can be used instead of, or as well as, decoupling capacitors $C_{d1}$ 202 in order to provide the required DC decoupling between the IF stage and the switching stage.

In order to provide evidence of the improvements that are achieved by embodiments of the invention, a design example using the QUBIC4X 0.25-μm SiGe:C BiCMOS technology will be described.

The example uses an LO frequency of 28.55 GHz and an IF frequency of 1.2 GHz. NPN Heterojunction Bipolar Transistor (HBT) transistors with emitter sizes of 0.5×1 μm$^2$ and 0.5×2 μm$^2$ are used for $Q_1$, $Q_2$ and $Q_3$ to $Q_6$. Metal-insulator-metal capacitors are used for $C_{d1}$ and $C_{d2}$. All the resistors are implemented with P+ base polysilicon type resistors. $R_{deg}$ is set to be 200Ω. The LO and IF powers are fixed to be –10 dBm and –20 dBm. $Q_3$ to $Q_6$ are biased with $I_c=I_{c3}=I_{c4}=I_{c5}=I_{c6}$. Monte Carlo mismatch simulations with 500 runs are carried out with ideal baluns and output buffers.

FIGS. 3a and 3b show the simulated mean value of LO feedthrough suppression (LOFT$_\mu$). FIG. 3a illustrates a simulation whereby $I_C$ is varied between 200 and 400 μA and L, is kept constant at 1.3nH. FIG. 3b illustrates a simulation whereby $L_c$ is varied between 1.1 nH and 1.3 nH and $I_c$ is kept constant at 300 μA. FIGS. 3a and 3b show the results for (i) a prior art Gilbert mixer with open/unshaded symbols; and (ii) a Gilbert mixer according to an embodiment of the invention with closed/shaded symbols.

FIG. 3a illustrates 1, being adjusted in two different ways. The first way involves varying the base voltage $V_{LO}$ of $Q_3$ to $Q_6$ with the fixed resistor values ($R_c$=800Ω, $R_e$=7.2 kΩ) and this is shown in FIG. 3a with square symbols. The second way involves (i) varying R, from 1.3 kΩ to 1.8 kΩ for the prior art Gilbert mixer and (ii) varying $R_e$ from 10 kΩ to 5 kΩ for the Gilbert mixer according to an embodiment of the invention, and these variations are shown with circular symbols in FIG. 3a.

FIGS. 3a and 3b show that the mixer according to an embodiment of the invention has a mean value for LO feedthrough suppression (LOFT$_\mu$) that is improved by 14 to 22 dB when compared with the prior art. This improvement is achieved because the LO feedthrough of the prior art mixer is dominated by the effect of mismatch between $I_{c1}$ and $I_{c2}$ (the DC currents through Q1 and Q2) in the transconductance stage of the Gilbert mixer, and this mismatch does not have a significant effect in one or more embodiments of the invention.

Furthermore, it can be seen from FIGS. 3a and 3b that reducing the value of 1, further improves the LO suppression of the Gilbert mixer according to an embodiment of the invention. This improvement with low values for 1, is not present in the prior art, and it can be seen in FIG. 3a that the prior art LOFT$_\mu$ profiles are flat across varying values for $I_c$. The improvement with lower values for $I_c$ cannot be achieved by the prior art as the mismatch that is introduced by the transistors Q1 and Q2 in the transconductance stage overwhelms any improvements that would otherwise be achieved by reducing $I_c$.

FIGS. 4a and 4b show the simulated standard deviation of LO feedthrough suppression (LOFT$_\sigma$). In the same way as FIGS. 3a and 3b, 1, is varied in FIGS. 4a and $L_c$ is varied for FIG. 4b. As is evident from FIGS. 4a and 4b, the standard deviation of LO feedthrough suppression is improved by 2.5 to 3 dB for an embodiment of the invention.

A Monte Carlo simulated histogram with $I_c$=300 μA and $L_c$=1.25 nH is shown in FIG. 5, where it can be seen that the standard deviation of LOFT is reduced by an embodiment of the invention and the mean value for LOFT is increased. This is evident from FIG. 5 as the number of Monte Carlo runs occupy a smaller range of LOFT values, and are at a higher absolute value.

Although embodiments disclosed herein include npn bipolar junction transistors (BJTs), it will be appreciated that pnp BJTs and field effect transistors (FETs) could also be used.

Embodiments of the invention can be applied for projects involving Ka-band (26.5-40 GHz) up-converters for Very Small Aperture Terminal (VSAT) applications, or any other projects requiring a low LO feedthrough.

The invention claimed is:

1. A Gilbert mixer comprising:
   four switching transistors, wherein each of the four switching transistors has a base, an emitter, and a collector;
   two intermediate frequency transistors, wherein both of the two intermediate frequency transistors has a base that receives an intermediate frequency signal, an emitter, and a collector; and
   pairs of DC decoupling components connected between the four switching transistors and the two intermediate frequency transistors in order to DC decouple the four switching transistors from the two intermediate frequency transistors, wherein each pair of DC decoupling components has a central node that is directly connected to the collector of one of the two intermediate frequency transistors.

2. The Gilbert mixer of claim 1, further comprising:
   a resistive component connected to an emitter of each of the four switching transistors in order to bias the four switching transistors.

3. The Gilbert mixer of claim 2, wherein each resistive component has a large resistance value and a small current flows through the four switching transistors, in use.

4. The Gilbert mixer of claim 3, wherein the resistance value of the resistive component is substantially 20 kΩ.

5. The Gilbert mixer of claim 1, wherein the pairs of DC decoupling components comprise pairs of capacitors.

6. The Gilbert mixer of claim 1, wherein the pairs of DC decoupling components comprise at least one of a filter, a transformer, and an amplifier.

7. The Gilbert mixer of claim 5, wherein the emitter of a first switching transistor is coupled to a first plate of a first decoupling capacitor, a second plate of the first decoupling capacitor is coupled to the collector of a first intermediate frequency transistor, the emitter of a second switching transistor is coupled to a first plate of a second decoupling capacitor, a second plate of the second decoupling capacitor is coupled to the collector of the first intermediate frequency transistor, the emitter of a third switching transistor is coupled to a first plate of a third decoupling capacitor, a second plate of the third decoupling capacitor is coupled to the collector of a second intermediate frequency transistor, the emitter of a fourth switching transistor is coupled to a first plate of a fourth decoupling capacitor, and a second plate of the fourth decoupling capacitor is coupled to the collector of the second intermediate frequency transistor.

8. The Gilbert mixer of claim 5, wherein the collector of a first switching transistor is coupled to a first plate of a first decoupling capacitor, a second plate of the first decoupling capacitor is coupled to one of the collector and the emitter of a first intermediate frequency transistor, the collector of a second switching transistor is coupled to a first plate of a second decoupling capacitor, a second plate of the second decoupling capacitor is coupled to one of the collector and the emitter of the first intermediate frequency transistor, the collector of a third switching transistor is coupled to a first plate of a third decoupling capacitor, a second plate of the third decoupling capacitor is coupled to one of the collector and the emitter of a second intermediate frequency transistor, the collector of a fourth switching transistor is coupled to a first plate of a fourth decoupling capacitor, and a second plate of the fourth decoupling capacitor is coupled to one of the collector and the emitter of the second intermediate frequency transistor.

9. The Gilbert mixer of claim 5, wherein the emitter of a first switching transistor is coupled to a first plate of a first decoupling capacitor, a second plate of the first decoupling capacitor is coupled to one of the collector and the emitter of a first intermediate frequency transistor, the emitter of a second switching transistor is coupled to a first plate of a second decoupling capacitor, a second plate of the second decoupling capacitor is coupled to one of the collector and the emitter of the first intermediate frequency transistor, the emitter of a third switching transistor is coupled to a first plate of a third decoupling capacitor, a second plate of the third decoupling capacitor is coupled to one of the collector and the emitter of a second intermediate frequency transistor, the emitter of a fourth switching transistor is coupled to a first plate of a fourth decoupling capacitor, and a second plate of the fourth decoupling capacitor is coupled to one of the collector and the emitter of the second intermediate frequency transistor.

10. A Gilbert mixer comprising:
    four switching transistors, wherein each of the four switching transistors has a gate, a source, and a drain;
    two intermediate frequency transistors, wherein each of the two intermediate frequency transistors has a gate that receives an intermediate frequency signal, a source, and a drain; and
    pairs of DC decoupling capacitors coupled between the four switching transistors and the two intermediate frequency transistors in order to DC decouple the four switching transistors from the two intermediate frequency transistors, wherein each pair of DC decoupling capacitors has a central node that is directly connected to the drain of one of the two intermediate frequency transistors, the source of the first switching transistor is coupled to a first plate of a first decoupling capacitor, a second plate of the first decoupling capacitor is coupled to the drain of a first intermediate frequency transistor, the source of a second switching transistor is coupled to a first plate of a second decoupling capacitor, a second plate of the second decoupling capacitor is coupled to the drain of the first intermediate frequency transistor, the source of a third switching transistor is coupled to a first plate of a third decoupling capacitor, a second plate of the third decoupling capacitor is coupled to the drain of a second intermediate frequency transistor, the source of a fourth switching transistor is coupled to a first plate of a fourth decoupling capacitor, and a second plate of the fourth decoupling capacitor is coupled to the drain of the second intermediate frequency transistor.

11. The Gilbert mixer of claim 7, further comprising:
    a resistor coupled between ground and the emitter of each of the switching transistors.

12. An integrated circuit comprising the Gilbert mixer of claim 5.

13. The Gilbert mixer of claim 1, wherein the central node of each pair of DC decoupling components is directly connected to a power supply by a bleeding resistor.

14. The Gilbert mixer of claim 10, wherein the central node of each pair of DC decoupling components is directly connected to a power supply by a bleeding resistor.

* * * * *